(12) United States Patent
Song et al.

(10) Patent No.: US 10,431,776 B2
(45) Date of Patent: Oct. 1, 2019

(54) WHITE ORGANIC LIGHT EMITTING DIODE AND DISPLAY DEVICE USING THE SAME

(71) Applicant: LG DISPLAY CO., LTD., Seoul (KR)

(72) Inventors: Ki-Woog Song, Goyang-si (KR); Sung-Hoon Pieh, Seoul (KR); Seung-Ryong Joung, Gwangmyeong-si (KR); Tae-Il Kum, Paju-si (KR); So-Yeon Ahn, Seoul (KR); Tae-Shick Kim, Yongin-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/473,889

(22) Filed: Aug. 29, 2014

(65) Prior Publication Data
US 2015/0060825 A1 Mar. 5, 2015

(30) Foreign Application Priority Data
Aug. 30, 2013 (KR) .................. 10-2013-0103707

(51) Int. Cl.
*H01L 51/52* (2006.01)
(52) U.S. Cl.
CPC ...... *H01L 51/5278* (2013.01); *H01L 51/5265* (2013.01)
(58) Field of Classification Search
CPC ............... H01L 51/504; H01L 27/3209; H01L 27/3211; H01L 27/3213; H01L 27/3216; H01L 27/3244; H01L 27/322; H01L 51/5278
See application file for complete search history.

(56) References Cited

U.S. PATENT DOCUMENTS

| | | | |
|---|---|---|---|
| 6,513,949 B1 * | 2/2003 | Marshall | H01L 25/0753 257/E25.02 |
| 2002/0047568 A1 * | 4/2002 | Koyama | 315/169.3 |
| 2006/0278887 A1 * | 12/2006 | Kanekiyo | C09K 11/7774 257/100 |

(Continued)

FOREIGN PATENT DOCUMENTS

| CN | 102097455 A | 6/2011 |
|---|---|---|
| CN | 102496682 A | 6/2012 |

(Continued)

*Primary Examiner* — Dale E Page
*Assistant Examiner* — Quovaunda Jefferson
(74) *Attorney, Agent, or Firm* — Dentons US LLP

(57) ABSTRACT

A white organic light emitting diode (OLED) includes a first electrode and a second electrode facing each other; a first charge generation layer and a second charge generation layer between the first and second electrodes; a first light emitting unit including a first emitting material layer emitting a first color, wherein the first light emitting unit is located between the first electrode and the first charge generation layer; a second light emitting unit including a second emitting material layer emitting a second color, wherein the second light emitting unit is located between the first charge generation layer and the second charge generation layer; and a third light emitting unit including a third emitting material layer emitting the second color, wherein the third light emitting unit is located between the second charge generation layer and the second electrode.

7 Claims, 7 Drawing Sheets

(56) References Cited

U.S. PATENT DOCUMENTS

| | | | | |
|---|---|---|---|---|
| 2011/0133227 A1* | 6/2011 | Lee | .................... | H01L 51/5036 |
| | | | | 257/89 |
| 2011/0215714 A1* | 9/2011 | Seo et al. | ....................... | 313/504 |
| 2012/0248424 A1* | 10/2012 | Sasaki | ................... | H01L 51/504 |
| | | | | 257/40 |
| 2019/0006524 A1* | 1/2019 | Guo | ................. | H01L 29/78636 |

FOREIGN PATENT DOCUMENTS

| | | | | |
|---|---|---|---|---|
| JP | 2003078175 A | * | 3/2003 | ............... F21K 9/00 |
| KR | 10-2008-0059807 | * | 7/2008 | |
| KR | 102009021070 A | | 2/2009 | |
| KR | 1020110063087 A | | 6/2011 | |
| KR | 10-2011-0065078 | * | 7/2011 | |
| KR | 1020110099645 A | | 9/2011 | |

* cited by examiner

WHITE ORGANIC LIGHT EMITTING DIODE AND DISPLAY DEVICE USING THE SAME

The present application claims the priority benefit of Korean Patent Application No. 10-2013-0103707 filed in Republic of Korea on Aug. 30, 2013, which is hereby incorporated by reference in its entirety for all purposes as if fully set forth herein.

BACKGROUND OF THE INVENTION

Field of the Invention

The present disclosure relates to a white organic light emitting diode that improves light emission efficiency and has low power consumption, and a display device using the same.

Discussion of the Related Art

With the continuous growth of an information society, the display field of displaying electric information signals has been rapidly advanced, and flat display devices having high performances of thin profile, light weight and low power consumption have been developed and used.

Among the various types of flat display devices, a liquid crystal display device (LCD) and an organic light emitting diode (OLED) display device are widely used.

Particularly, since a OLED display device includes self-luminous feature, the OLED display device has advantages of light weight and thin profile compared to a LCD device which requires a light source such as a backlight unit.

Further, compared to the LCD, the OLED display device has advantages of excellent viewing angle and contrast ratio, fast response speed, and the OLED display device has low power consumption, low DC voltage driving thus has advantages of easy fabrication and design of driving circuit. Further, since components in the OLED device are solid, the OLED device has advantages of being strong to external impact, and wide range of operating temperature.

An OLED display device having the above advantages has been researched for application in various fields of portable computer and desktop computer and wall-mount TV as well. In particular, research has been done to increase display sizes.

The OLED display device includes a display panel including an OLED having first and second electrodes and an organic light emitting layer of self-luminance between the first and second electrodes.

The OLED uses principle that when voltages are applied to the first and second electrodes, electron and hole injected from the first and second electrodes are coupled in the organic light emitting layer to generate exiton, and the exiton falls from an excited state to a ground state to emit light The organic light emitting layer is generally formed in a deposition method using a shadow mask including a transmitting portion and a blocking portion.

For example, a shadow mask is first aligned to form a red organic light emitting layer on a substrate, and the transmitting portion is positioned corresponding to an area to form the red organic light emitting layer, and the blocking portion is positioned corresponding to other areas to form green and blue organic light emitting layers. Accordingly, an organic material is transmitted through the transmitting portion and forms the red organic light emitting layer, and the organic material is blocked at the other areas by the blocking portion. This method is repeated to form the green organic light emitting layer and the blue organic light emitting layer.

However, it is difficult to apply the deposition method using the shadow mask to fabrication of a large-sized display device.

In other words, as the size of the shadow mask increases, the shadow mask partially sags due to its weight. There is a limit in coping with the sagging, and thus it is hard to apply the shadow mask several times to form organic light emitting layers of different colors. Accordingly, the organic light emitting layers do not form uniformly, and thus defects are caused.

Further, the shadow mask is required to increase in size according to an increase of the size of the display device. But, there is limit to an area of the shadow mask available in fabricating the shadow mask.

Further, even though the red, green and blue organic light emitting layers are formed in the respective pixel regions using the shadow mask, since the red, green and blue organic light emitting layers have different life spans, there occurs a problem that the life span of the display device ends when the blue organic light emitting layer, which has a life span shorter than others, is deteriorated.

SUMMARY OF THE INVENTION

Accordingly, the present invention is directed to a white OLED and a display device including the same including an organic light emitting layer formed in vertical structure without use of a shadow mask.

Further, the present invention is directed to a white OLED and a display device including the same that improve light emission efficiency by vertically forming three-layered light emitting unit, and obtain low power consumption by minimizing total thickness.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, a white organic light emitting diode (OLED) includes a first electrode and a second electrode facing each other; a first charge generation layer and a second charge generation layer between the first and second electrodes; a first light emitting unit including a first emitting material layer emitting a first color, wherein the first light emitting unit is located between the first electrode and the first charge generation layer; a second light emitting unit including a second emitting material layer emitting a second color, wherein the second light emitting unit is located between the first charge generation layer and the second charge generation layer; and a third light emitting unit including a third emitting material layer emitting the second color, wherein the third light emitting unit is located between the second charge generation layer and the second electrode.

In another aspect, an organic light emitting diode (OLED) display device includes a pixel driving layer on a substrate; a color filter pattern including at least three different color filter patterns that correspond to respective pixel regions; a first electrode connected to a thin film transistor of the pixel driving layer; a second electrode facing the first electrode; a first charge generation layer and a second charge generation layer between the first and second electrodes; a first light emitting unit including a first emitting material layer emitting a first color, wherein the first light emitting unit is located between the first electrode and the first charge generation layer; a second light emitting unit including a second emitting material layer emitting a second color, wherein the second light emitting unit is located between the first charge generation layer and the second charge generation layer; and a third light emitting unit including a third emitting material layer emitting the second color, wherein the third light emitting unit is located between the second charge generation layer and the second electrode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings.

Figure 1:
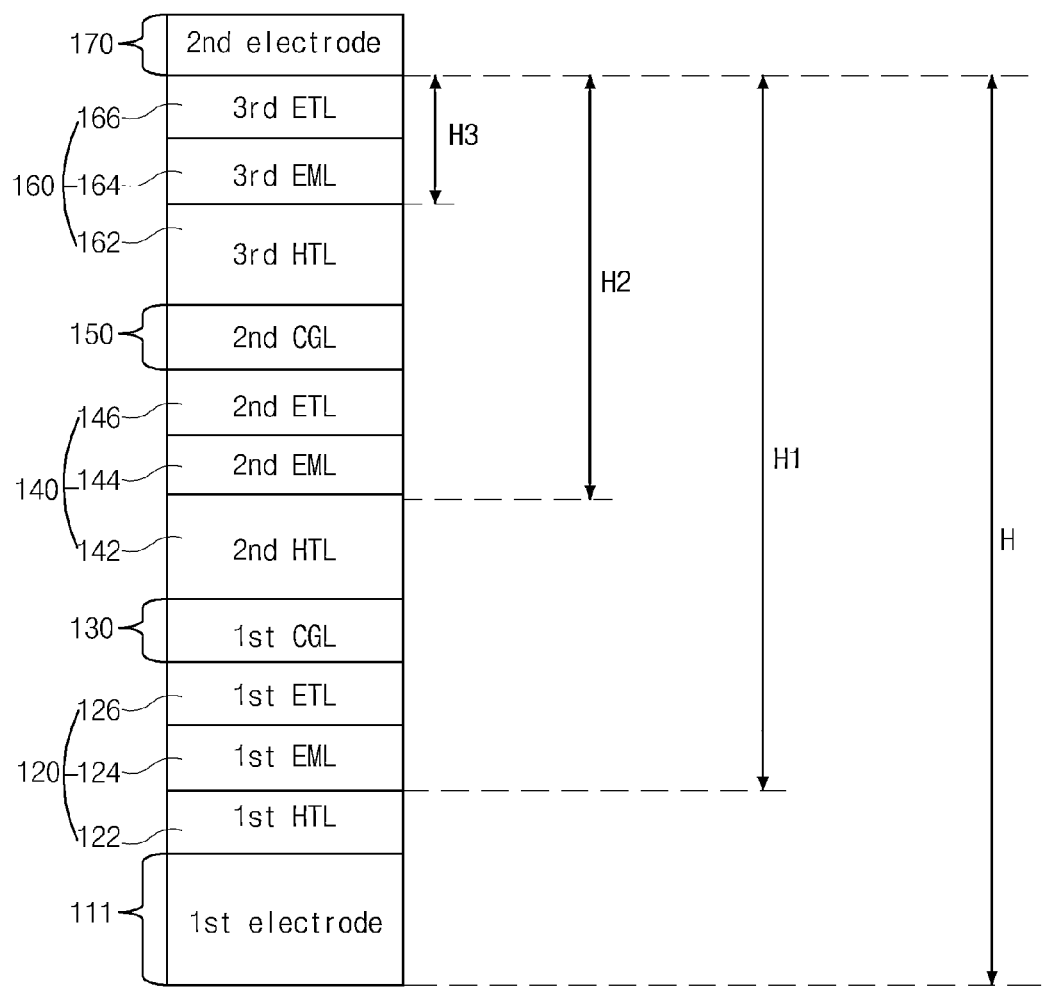
FIG. 1 is a schematic cross-sectional view illustrating a white OLED according to an embodiment of the present invention.
Figure 2:
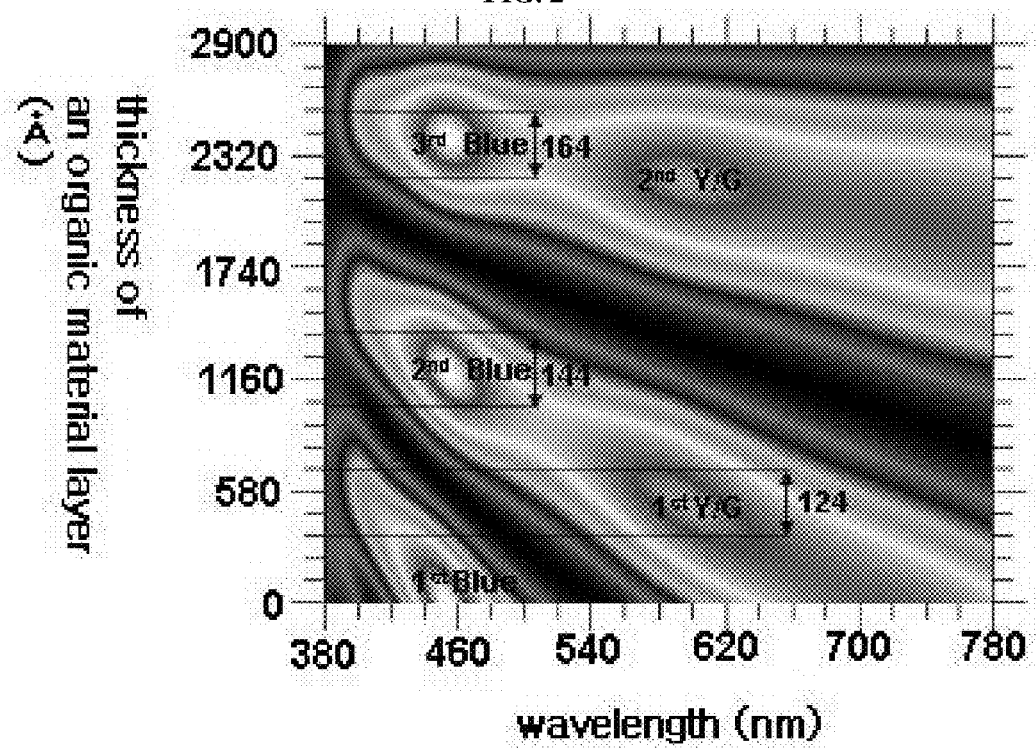
FIG. 2 is a contour map illustrating emittance to wavelength according to thickness of an organic material layer according to a first embodiment of the present invention.

FIG. 1 is a schematic cross-sectional view illustrating a white OLED according to a first embodiment of the present invention, and FIG. 2 is a contour map illustrating emittance to wavelength according to thickness of an organic material layer according to the first embodiment of the present invention.

As shown in FIG. 1, the white OLED 110 includes a first electrode 111 and a second electrode 170 opposite to the first electrode 111, and an organic light emitting layer between the first and second electrodes 111 and 170, and the organic light emitting layer includes first to third light emitting units 120, 140 and 160, and a first charge generation layer (CGL) 130 between the first and second light emitting units 120 and 140, and a second CGL 150 between the second and third light emitting units 140 and 160.

The first electrode 111 may be made of a material having a relatively high work function, for example, a transparent conductive material such as indium-tin-oxide (ITO) or indium-zinc-oxide, and function as an anode.

The second electrode 170 may be made of a material having a relatively low work function, for example, a metal material such as aluminum alloy (e.g., AlNd or AlMg), silver (Ag), magnesium (Mg) or gold (Au), and function as a cathode.

Each of the first to third light emitting units 120, 140 and 160 includes a common layer and an emitting material layer (EML). The common layer includes a hole transporting layer (HTL) and an electron transporting layer (ETL).

In more detail, the first light emitting unit 120 includes a first HTL 122, a first EML 124 emitting a first color and a first ETL 126, which are between the first electrode 111 and the first CGL 130. The second light emitting unit 140 includes a second HTL 142, a second EML 144 emitting a second color and a second ETL 146, which are between the first CGL 130 and the second CGL 150. The third light emitting unit 160 includes a third HTL 162, a third EML 164 emitting a third color and a third ETL 166, which are between the second CGL 150 and the second electrode 170.

The electron transporting layer (ETL) may be at least one of materials expressed with the following chemical formulas I-a and I-b:

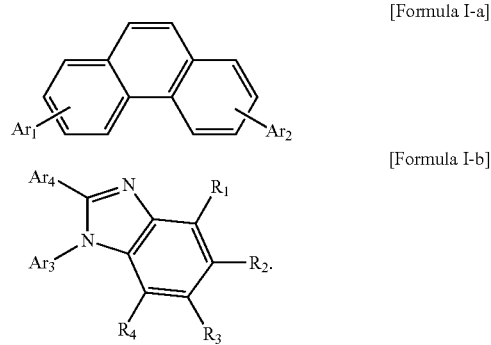

[Formula I-a]

[Formula I-b]

In the above formulas, Ar1 to Ar4 each are an aryl group which may be selected from a group consisting of phenyl, naphthalene, fluorene, carbazole, phenazine, phenanthroline, phenanthridine, acridine, cinnoline, quinazoline, quinoxaline, naphthydrine, phtalazine, quinolizine, indole, indazole, pyridazine, pyrazine, pyrimidine, pyridine, pyrazole, imidazole and pyrrole.

Rn (n=1 to 4) is selected from a group consisting of a substituted or nonsubstituted C6-C24 aryl group, a substituted or nonsubstituted C10-C30 condensed aryl group, a substituted or nonsubstituted C2-C24 heteroaryl group, a substituted or nonsubstituted C1-C24 alkyl group, a substituted or nonsubstituted C6-C24 heteroalkyl group, a substituted or nonsubstituted C3-C24 cycloalkyl group, a substituted or nonsubstituted C1-C24 alkoxy group, a substituted or nonsubstituted C6-C24 aryloxy group, a substituted or nonsubstituted C1-C24 alkylsilyl group, a substituted or nonsubstituted C6-C24 arylsilyl group, a cyano group, a halogen group, a deuterium (D), and hydrogen (H).

The hole transporting layer (HTL) may be a material expressed in the following chemical formula II-a, in which A and B each are one of materials expressed with the following chemical formulas II-b, II-c and II-d:

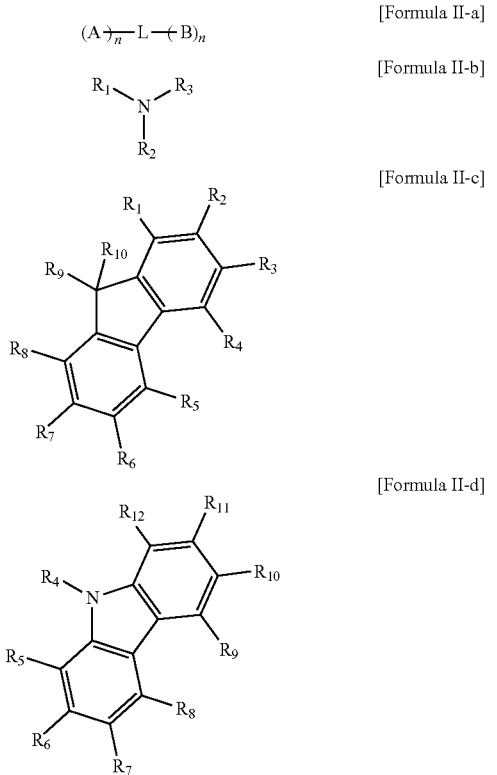

[Formula II-a]
[Formula II-b]
[Formula II-c]
[Formula II-d]

In the above formulas, Rn (n=1 to 12) of A or B may be selected from a group consisting of a substituted or nonsubstituted C6-C24 aryl group, a substituted or nonsubstituted C10-C30 condensed aryl group, a substituted or nonsubstituted C2-C24 heteroaryl group, a substituted or nonsubstituted C1-C24 alkyl group, a substituted or nonsubstituted C6-C24 heteroalkyl group, a substituted or nonsubstituted C3-C24 cycloalkyl group, a substituted or nonsubstituted C1-C24 alkoxy group, a substituted or nonsubstituted C6-C24 aryloxy group, a substituted or nonsubstituted C1-C24 alkylsilyl group, a substituted or nonsubstituted C6-C24 arylsilyl group, a cyano group, a halogen group, a deuterium, and hydrogen. R1 to R12 may form a condensed ring with a neighboring substituent.

L is an aryl group which may be selected from a group consisting of phenyl, naphthalene, fluorene, carbazole, phenazine, phenanthroline, phenanthridine, acridine, cinnoline, quinazoline, quinoxaline, naphthydrine, phtalazine, quinolizine, indole, indazole, pyridazine, pyrazine, pyrimidine, pyridine, pyrazole, imidazole and pyrrole.

The first EML 124 is doped with a phosphorescent dopant material to emit the first color, for example, a yellowish green or a red-green. To do this, a single dopant of a yellowish green phosphorescent dopant, a mixture of yellow phosphorescent dopant and green phosphorescent dopant, or a mixture of red phosphorescent dopant and green phosphorescent dopant may be used.

In addition to the dopant, a main ingredient i.e., a host may be contained in the first EML 124. For example, a single host may be used, or a mixture of at least two hosts may be used to reinforce hole transport property or electron transport property. In this case, a content ratio of the phosphorescent dopant to the host may be about 25% or less.

The second EML 144 may be made of a blue fluorescent material to emit the second color, i.e., a blue.

The third EML 164 may be made of a blue fluorescent material to emit the third color i.e., a blue, which is the same as the second color of the second EML 144.

Figure 8:
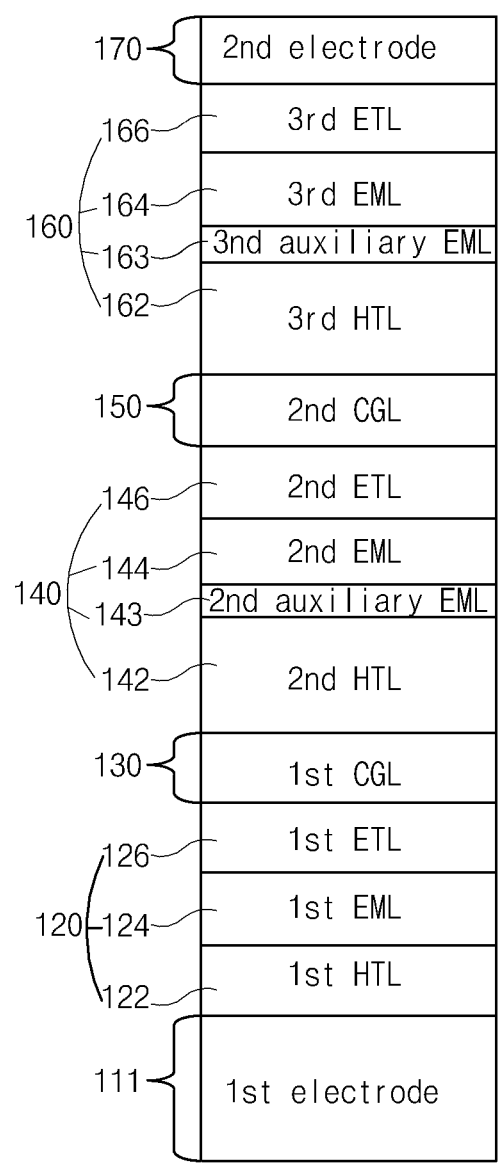
FIG. 8 is a cross-sectional view illustrating a white OLED of an OLED display device according to an alternative embodiment of the present invention.

In an alternative embodiment, referring to FIG. 8, a second auxiliary emitting material layer 143, which has a light emission efficiency less than that of the second EML 144, may be formed below the second EML 144, and a third auxiliary emitting material layer 163, which has a light emission efficiency less than that of the third EML 164, may be formed below the third EML 164. In this case, the auxiliary EMLs 143 and 163 may emit the same color as the corresponding EMLs 144 and 164 in order to further improve color purity, or may emit a color different from the corresponding EMLs 144 and 164. In the case of emitting a different color, the auxiliary EML may emit red or green. To do this, the auxiliary EMLs 143 and 163 may be made of a host material of the corresponding EMLs 144 and 164, and may be preferably formed at half the thickness of the corresponding EMLs 144 and 164 or less in order to prevent reduction of light emission efficiency.

By forming the EMLs emitting blue to be vertically separated, since the second light emitting unit 140 including the second EML 144, and the third light emitting unit 160 including the third EML 164 each emit blue, there are advantages of increased life span, increase of efficiency of blue, and increase of color stability in blue.

The second and third EMLs 144 and 164 may be made of blue phosphorescent material instead of blue fluorescent material. However, the blue fluorescent material is more advantageous to longer life span than the blue phosphorescent material.

Further, it is shown in the drawings that the common layer includes the HTL and the ETL. However, the common layer may further include other layers, for example, a hole injection layer (HIL) and an electron injection layer (EIL).

The first and second CGLs 130 and 150 each function to adjust charge balance between the first to third light emitting units 120, 140 and 160 adjacent thereto, and the CGL is referred to as an intermediate connector layer (ICL).

Each of the first and second CGLs 130 and 150 may be formed of a material having low optical and electrical loss property, for example, a metal material, an oxide material or an organic material, or a structure that at least one of such the materials is stacked up. The metal material may be at least one of Li, Na, K, Rb, Cs, Ma and Ca. The oxide material may be at least one of $Li_2O$, CaO and MgO. The organic material may be at least one of first to third materials expressed with the following chemical formulas III-a, III-b and III-c, respectively:

[Formula III-a]

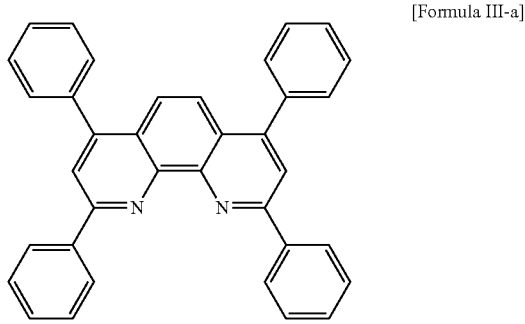

[Formula III-a]

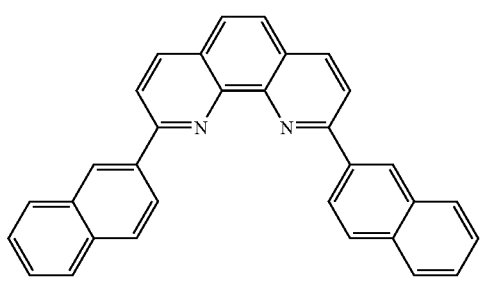

[Formula III-a]

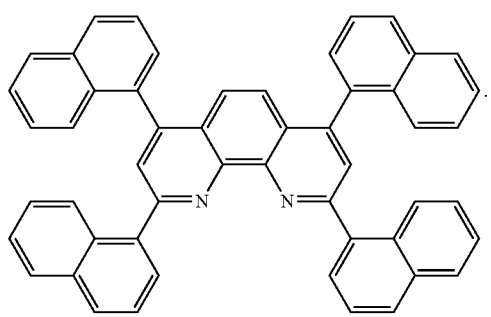

Alternatively, instead of the above organic material, each of the first and second CGLs 130 and 150 may be formed of the above material for the electron transporting layer (ETL) doped with the above metal material or oxide material.

Even though not shown in the drawings, the first CGL 130 may include an intermediate connection metal layer assisting electron injection to the first light emitting unit 120, and an intermediate connection hole injection layer assisting hole injection to the second light emitting unit 140, and similarly, the second CGL 150 may include an intermediate connection metal layer assisting electron injection to the second light emitting unit 140, and an intermediate connection hole injection layer assisting hole injection to the third light emitting unit 160.

In this case, the intermediate connection metal layer may be made of an organic material layer doped with alkali metal material having good electron injection property.

The organic material for the intermediate connection metal layer may be the above organic material for the first and second CGLs 130 and 150 i.e., at least one of the above first to third materials expressed in the following chemical formulas III-a, III-b and III-c and the above material for the electron transporting layer (ETL). The alkali metal material to dope the organic material for the intermediate connection metal layer may be at least one of Li, Na, K, Rb, Cs, Ma and Ca.

The intermediate connection hole injection layer may be made of a P (positive) type organic semiconductor material, for example, be made of the above material for the hole transporting layer (HTL) doped with a P type dopant.

The P type dopant may be at least one of materials expressed with the following chemical formulas IV-a, IV-b and IV-c:

[Formula IV-a]

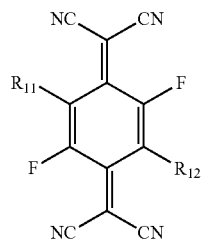

[Formula IV-b]

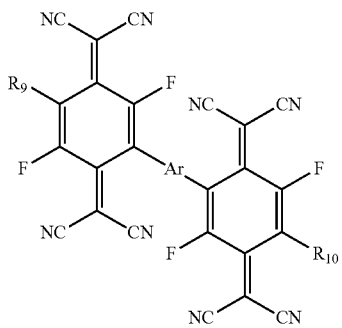

[Formula IV-c]

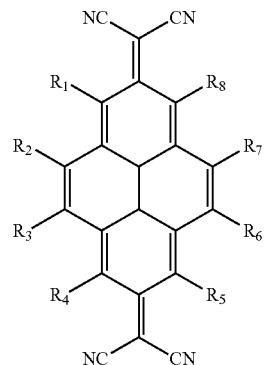

In the above formulas, R1 to R12 each may be selected from a group consisting of H, D, CF3,

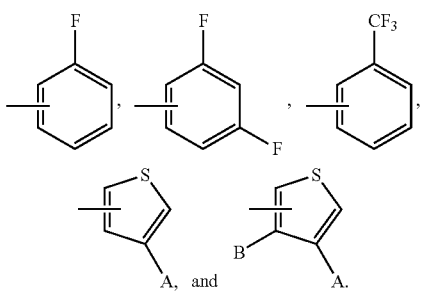

Ar may be selected from a group consisting of substituted or nonsubstituted phenyl, naphthalene, fluorene, carbazole, phenazine, phenanthroline, phenanthridine, acridine, cinnoline, quinazoline, quinoxaline, naphthydrine, phtalazine, quinolizine, indole, indazole, pyridazine, pyrazine, pyrimidine, pyridine, pyrazole, imidazole and pyrrole, or a group expressed for R1 to R12 as above.

A and B each may be selected from H, D, F, and $CF_3$.

The white OLED 110 of the above structure mixes a phosphorescent light from the first light emitting unit 120 and a blue light from the second and third light emitting units 140 and 160.

As such, the white OLED 110 is configured such that the first light emitting unit 120 emitting yellowish green, and the second and third light emitting units 140 and 160 emitting blue are formed in a vertically stacked structure to ultimately emit white, and particularly, the two light emitting units 140 and 160 emitting blue are formed, and thus light emission efficiency can increase.

Further, the white OLED 110 is formed such that a thickness H of the organic material, which is measured from the first electrode 111 (i.e., an outer surface (or a bottom surface) of the first electrode 111) to a bottom surface (i.e., an inner surface) of the second electrode 170 and includes a thickness of the first electrode 111, is about 3500 angstroms to about 4500 angstroms, a first thickness H1, which is measured from the bottom surface of the first EML 124 to the bottom surface of the second electrode 170, is about 2100 angstroms to about 2600 angstroms, a second thickness H2, which is measured from the bottom surface if the second EML 144 to the bottom surface of the second electrode 170, is about 1550 angstroms to about 1900 angstroms, and a third thickness H3, which is measured from the bottom surface of the third EML 164 to the bottom surface of the second electrode 170, is about 250 angstroms to about 800 angstroms.

The thickness H of the organic material is close to a thickness of a comparative white OLED. In other words, the thickness H hardly increases even though the OLED 110 has the first to third light emitting units 120, 140 and 160. Thus, light emission efficiency increases and power consumption is low. Accordingly, the white OLED 110 having high efficiency and operated with low voltage can be realized.

When the first electrode 111 is made of a transparent conductive material, light emitted from the first to third light emitting units 120, 140 and 160 can be emitted through the first electrode 111.

Alternatively, when the second electrode 170 is transparent, light from the first to third light emitting units 120, 140 and 160 can be emitted through the second electrode 170.

A property of emittance to wavelength according to thickness of organic material layer, between the first and second electrodes, of the white OLED of the embodiment is explained with reference to FIG. 2.

The horizontal axis indicates wavelength, and the vertical axis indicates a thickness i.e., a height of organic material between the first electrode 111 and the second electrode 170. The zero "0" at the vertical axis is a surface i.e., a bottom surface of the first electrode 111, and the top end at the vertical axis is a bottom surface of the second electrode 170. In this case, the first electrode 111 has a thickness of about 1200 angstroms.

A color of the contour map indicates intensity of light. In other words, intensity of light decreases in the order of red, orange, yellow, green, blue, purple and violet, and intensity of light is maximum at red which is located at a peak point of the contour map.

Each EML may be formed at each region (i.e., position) having resonance condition where intensity of light is maximum. Accordingly, by selecting a position of each EML in a range to adjust a thickness of all the organic material, the white OLED of maximum efficiency can be obtained. In this case, EMLs of different colors are selected such that regions having maximum intensities of light are located at different wavelength regions.

In other words, resonance condition meeting maximum intensity of light may be varied according to thickness range of the organic material between the first and second electrodes 111 and 170, and in such the resonance condition, regions having maximum intensity of light to maximize efficiency of light emission may be selected, and EMLs may be located at such the regions, respectively.

The white OLED 110 may be characterized in that the total thickness of the organic material layer including the first electrode 111 is in a range of about 3500 angstroms to about 4500 angstroms.

In this case, referring to FIG. 2, in the range of the total thickness of about 2300 angstroms to about 3300 angstroms of the organic material layer excluding the first electrode 111, there are two resonance conditions for yellowish green (Y/G) light at wavelength near about 560 nanometers, and there are two resonance conditions for blue light at wavelength near about 460 nanometers.

Accordingly, the first EML 124 of yellowish green can be formed at a first region of the wavelength near about 560 nanometers, the second EML 144 of blue can be formed at a second region of the wavelength near about 460 nanometers, and the third EML 164 of blue can be formed at a third region of the wavelength near about 460 nanometers.

As described above, by selecting a position of each EML at the corresponding region having maximum intensity of light to maximize efficiency of light emission in the range of the total thickness of the organic material layer, about 2300 angstroms to about 3300 angstroms, the white OLED having high efficiency of light emission and low power consumption can be obtained.

Figure 3:
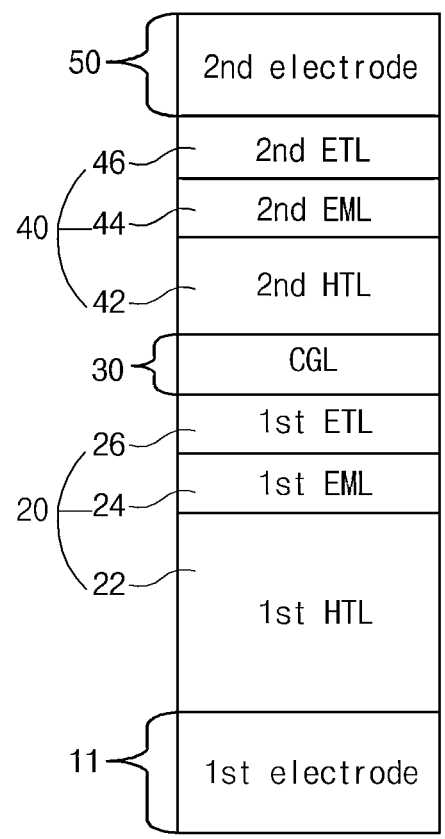
FIG. 3 is a cross-sectional view illustrating a white OLED according to a comparative example.
Figure 4:
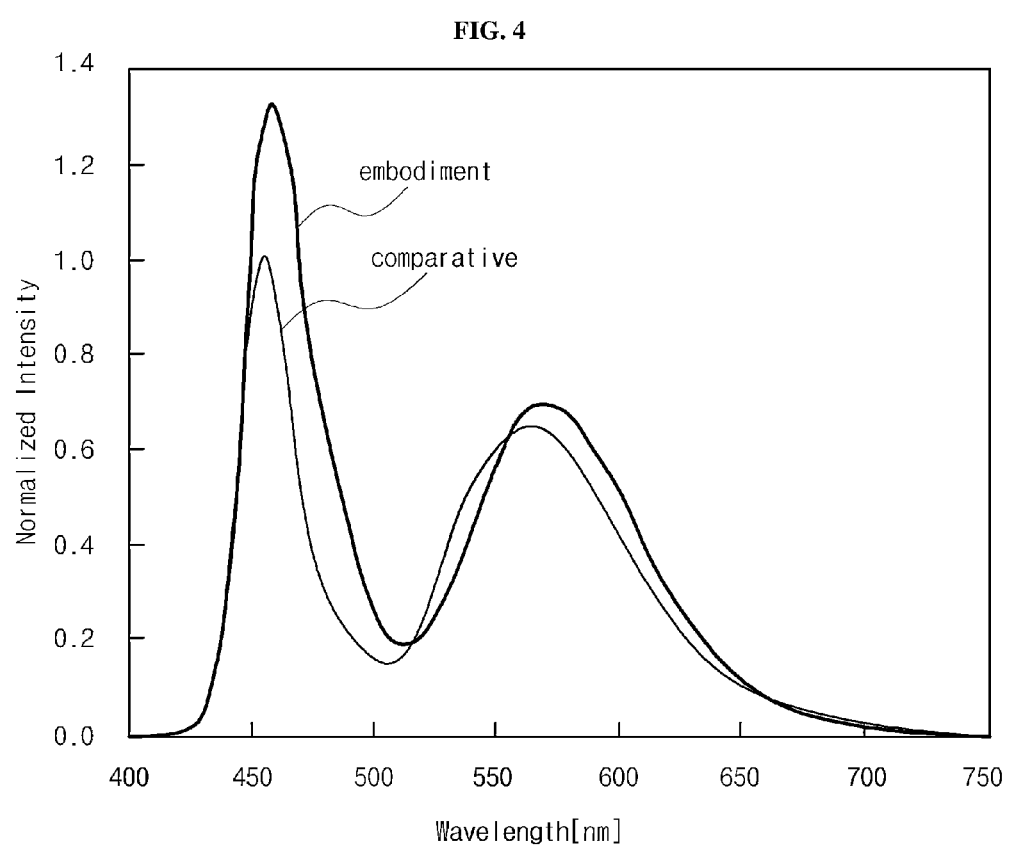
FIG. 4 is a graph illustrating intensity of light to wavelength of the OLEDs of the embodiment and the comparative example.

FIG. 3 is a cross-sectional view illustrating a white OLED according to a comparative example, and FIG. 4 is a graph illustrating intensity of light to wavelength of the OLEDs of the first embodiment and the comparative example.

Referring to FIG. 3, the comparative OLED 1 includes a first electrode 11, a first light emitting unit 20 emitting blue, a CGL 30, a second light emitting unit 40 emitting yellowish green, and a second electrode 50.

The first light emitting unit 20 includes a first EML emitting blue, and the second light emitting unit 40 includes a second EML doped with phosphorescent dopant and emitting yellowish green.

In the vertical structure, the comparative white OLED 1 does not have a similar third light emitting unit 160 of the white OLED 110 of the first embodiment. In other words, the comparative white OLED 1 has a structure similar to the white OLED 110 of the first embodiment except for the third light emitting unit 160 and the second CGL 150.

A total thickness of the comparative white OLED 1 is similar to that of the white OLED of the first embodiment 110 of FIG. 1. Referring to FIG. 2 regarding the comparative white OLED 1, there are two resonance conditions for yellowish green light at a wavelength near about 560 nanometers, and there are three resonance conditions for blue light at a wavelength near about 460 nanometers. Accordingly, in the comparative white OLED 1, the first EML of blue is formed at a second region of the wavelength near about 460 nanometers, the second EML of yellowish green is formed at a second region of the wavelength near about 560 nanometers. Thus, the comparative white OLED 1 has a total thickness similar to the total thickness H of the white OLED 110 of the first embodiment of FIG. 1.

Intensity of light according to wavelength of the comparative white OLED 1 and the white OLED 110 of the first embodiment of FIG. 1 is explained with reference to FIG. 4.

Referring to FIG. 4, both the comparative white OLED 1 and the white OLED 110 have a first light emission peak at blue, and a second light emission peak at yellowish green or yellow.

However, the first and second light emission peaks of the first embodiment of the OLED 110 are greater than the comparative OLED 1 first and second light emission peaks, respectively.

Therefore, the efficiency of the white OLED 110 which further includes the third light emitting unit 160 emitting blue, is better than that of the comparative white OLED 1.

Moreover, even though the white OLED 110 further includes the third light emitting unit 160, the white OLED 110 is formed at the thickness similar to that of the comparative white OLED 1. Thus, the thickness of all the organic material can be minimized. Accordingly, increase of efficiency and low power consumption can be obtained.

Figure 5:
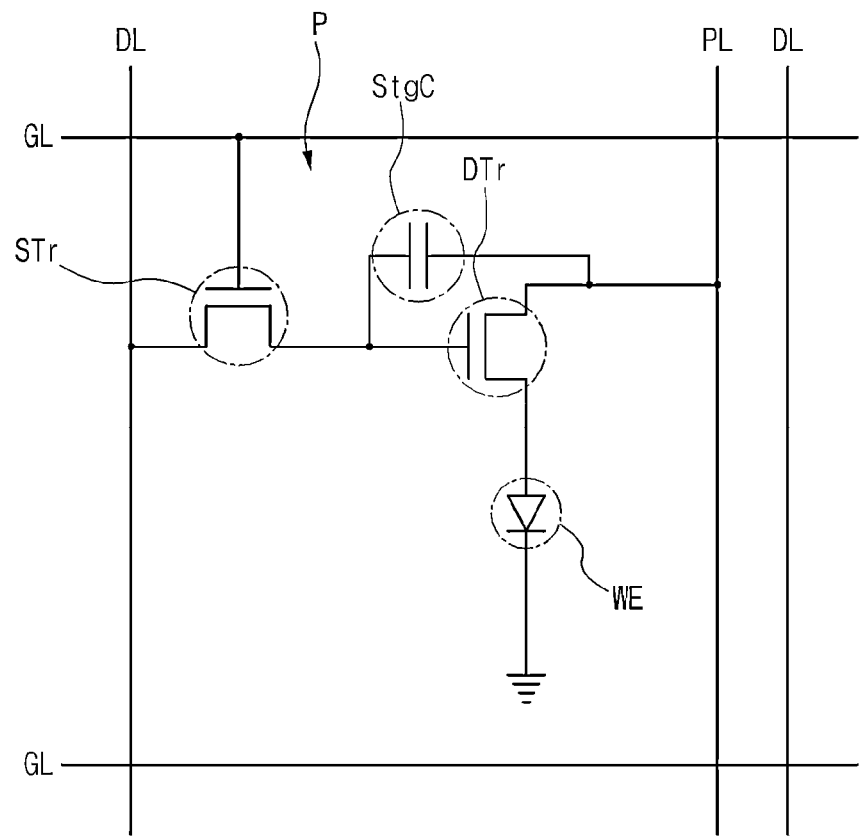
FIG. 5 is a circuit diagram of a pixel of an OLED display device including the white OLED according to the embodiment of the present invention.
Figure 6:
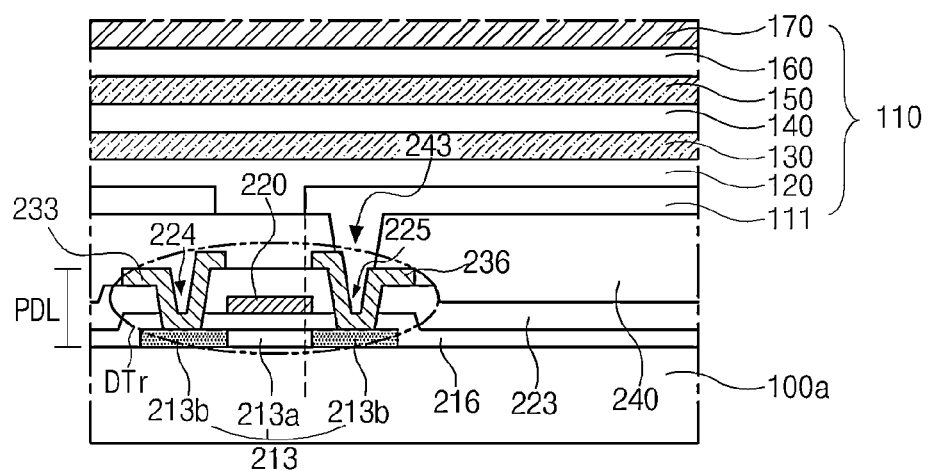
FIG. 6 is a cross-sectional view of the OLED display device according to the embodiment of the present invention.

FIG. 5 is a circuit diagram of a pixel of an OLED display device including the white OLED according to the first embodiment of the present invention, and FIG. 6 is a cross-sectional view of the OLED display device according to the first embodiment of the present invention.

Referring to FIG. 5, the pixel P of the OLED display device includes a switching thin film transistor (TFT) STr, a driving TFT DTr, a storage capacitor StgC, and a white OLED WE.

A gate line GL is formed along a first direction, and a data line DL is formed along a second direction crossing the first direction to define the pixel region. A power line PL supplying a power voltage is spaced apart from the data line DL.

The switching TFT STr is formed near the crossing portion of the gate line GL and the data line DL, and the driving TFT DTr is connected to the switching TFT STr.

An end terminal i.e., a first electrode of the white OLED WE is connected to a drain electrode of the driving TFT DTr, and the other end terminal i.e., a second electrode of the white OLED WE is grounded.

The storage capacitor StgC is connected between a gate electrode and a source electrode of the driving TFT DTr, and the power line PL supplies the power voltage to the source electrode of the driving TFT DTr.

When a gate signal is applied through the gate line GL, the switching TFT STr is turned on, and a data signal is transferred through the data line DL and the switching TFT STr to the driving TFT DTr so that the driving TFT DTr is turned on and the white OLED WE emits light. A current flowing to the white OLED WE is determined according to the data signal, and thus gray scale of the pixel P can be realized according to the data signal applied thereto.

The storage capacitor StgC functions to store and maintain a voltage of the gate electrode of the driving TFT DTr when the switching TFT is turned off. Accordingly, the current flowing to the white OLED WE is maintained until the next frame.

The structure of the OLED display device is explained in detail with reference to FIG. 6. For the purpose of explanation, the switching TFT STr, which is similar to the driving TFT DTr, is not shown in FIG. 6. A region where the driving TFT DTr is formed is referred to as a driving region and a region where the switching TFT STr is formed is referred to as a switching region.

Referring to FIG. 6, the OLED display device 100 includes a pixel driving layer including the driving TFT DTr and the switching TFT (STr of FIG. 5), a color filter layer 240 on the pixel driving layer (PDL), and a substrate 100a on which the white OLED 110 is formed.

The substrate 100a may be a glass substrate, a thin substrate of flexibility, or a plastic substrate.

The thin substrate of flexibility may be made of at least one of PES (polyethersulfone), PEN (polyethylenenaphthalate), PET (polyethylene terephthalate), PC (polycarbonate) and PI (polyimide).

A semiconductor layer 213 is formed on the substrate 100a, and includes a first region 213a as a channel at a center portion, and second regions 213b at both sides of the center portion doped with impurities at high concentration.

Even though not shown in the drawings, a buffer layer may be formed between the substrate 100a and the semiconductor layer 213. The buffer layer may be made of an inorganic insulating material, for example, silicon oxide ($SiO_2$) or silicon nitride (SiNx). The buffer layer functions to prevent reduction of property of the semiconductor layer 213 due to alkali ions emitted from the substrate 100a.

A gate insulating layer 216 is formed on the semiconductor layer 213, and a gate electrode 220 and a gate line (GL of FIG. 5) are formed on the gate insulating layer 216. The gate electrode 220 is located to correspond to the first region 213a.

An inter-layered insulating layer 223 is formed on the gate electrode 220 and the gate line. The inter-layered insulating layer 223 and the gate insulating layer 216 include first and second semiconductor contact holes 224 and 225 exposing the respective second regions 213b.

A power line (PL of FIG. 5) and a data line (DL of FIG. 5) are formed on the inter-layered insulating layer 223. Further, source and drain electrodes 233 and 236 are formed on the inter-layered insulating layer 223 and contacts the respective second regions 213b through the first and second contact holes 224 and 225.

The source and drain electrodes 233 and 236, the semiconductor layer 213, the gate insulating layer 216 and the gate electrode 220 form the driving TFT DTr.

The switching TFT (STr of FIG. 5) has a structure similar to the driving TFT DTr. A gate electrode of the switching TFT is connected to the gate line, a source electrode of the switching TFT is connected to the data line, and a drain electrode of the switching TFT is connected to the driving TFT DTr.

A color filter layer 240 may be formed on the source and drain electrodes 233 and 236 and the inter-layered insulating layer 223.

The color filter layer 240 includes red, green and blue color filter patterns separately formed in respective pixels. The color filter layer 240 includes a drain contact hole 243 exposing the drain electrode 236. Because of the color filter layer 240, the OLED display device 100 can display a full-colored image.

A first electrode 111 is formed on the color filter layer 240 in each pixel region, and contacts the drain electrode 236 through the drain contact hole 243.

A first light emitting unit 120, a first CGL 130, a second light emitting unit 140, a second CGL 150, a third light emitting unit 160, and a second electrode 170 are sequentially formed on the first electrode 111. These components are explained in detail as above, so explanations thereof are omitted.

The first and second electrodes 111 and 170, and the first light emitting unit 120, the first CGL 130, the second light emitting unit 140, the second CGL 150 and the third light emitting unit 160 between the first and second electrodes 111 and 170 form the white OLED 110.

When the first electrode 111 is made of a conductive material having light transparency, light emitted from the first to third light emitting units 120, 140 and 160 passes through the first electrode 111 to the outside so that the OLED display device 100 is operated in a bottom emission type.

Alternatively, when the second electrode 170 is transparent, light emitted from the first to third light emitting units 120, 140 and 160 passes through the second electrode 170 to the outside so that the OLED display device 100 is operated in a top emission type. In this case, positions of the first to third light emitting units 120, 140 and 160 may change.

Even though not shown in the drawings, a protection layer may be formed on the second electrode 170 so as to protect the white OLED 110 from foreign substances such as moisture or oxygen in the atmosphere permeating the white OLED 110. The protection layer may be made of an inorganic insulating material such as silicon oxide ($SiO_2$) or silicon nitride (SiNx), or aluminum oxide (AlOx). Alternatively, the protection layer may be formed to have multiple-layered structure including at least an inorganic material layer and at least an organic material layer.

The OLED display device 100 may include an encapsulation substrate that functions to encapsulate the substrate 100a having the above-described components thereon. In this case, the substrate 100a and the encapsulation substrate are spaced apart from each other, and are sealed and attached to each other using a seal pattern, which is located between peripheral portions of the substrate 100a and the encapsulation substrate, to manufacture a display panel. Alternatively, the substrate 100a and the encapsulation substrate are assembled with a front assembly method using a face seal or the like to manufacture a display panel.

A black matrix may be formed on the encapsulation substrate at positions (i.e., non-display regions) corresponding to peripheral portions of each pixel region. Alternatively, the black matrix may be formed on the substrate 100a.

The color filter layer may be formed at a position other than on the pixel driving layer (PDL), for example, on the white OLED, which is explained with reference to FIG. 7.

Figure 7:
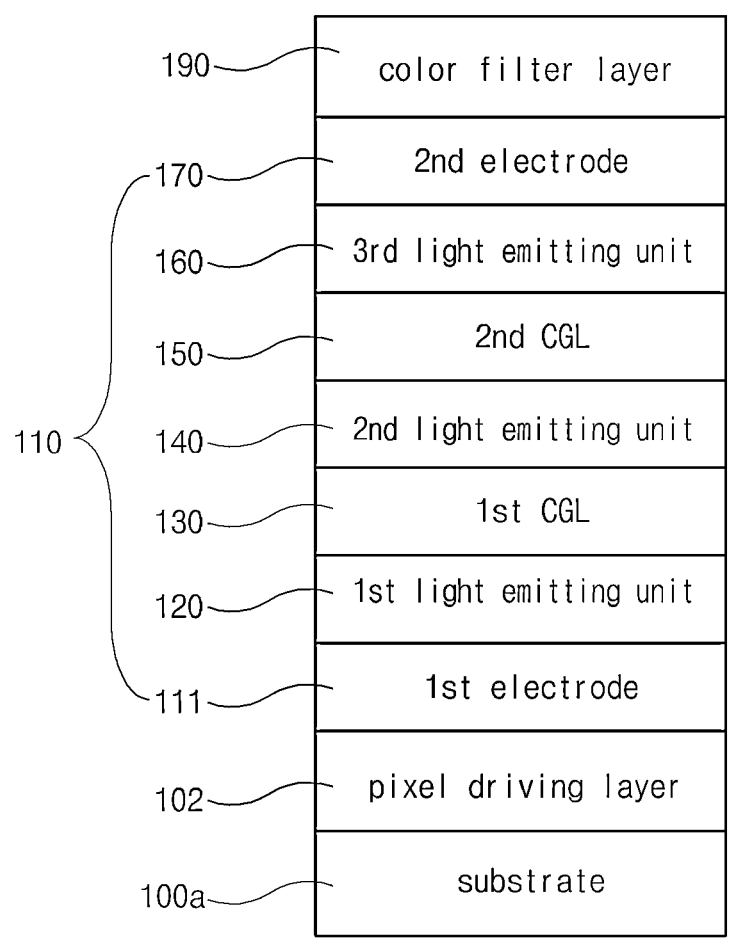
FIG. 7 is a cross-sectional view illustrating a white OLED of an OLED display device according to a second embodiment of the present invention.

FIG. 7 is a cross-sectional view illustrating a white OLED of an OLED display device according to a second embodiment of the present invention. The structure of the OLED of the second embodiment is similar to that of the above first embodiment except for the color filter layer. Thus, detailed explanations of similar components are omitted.

Referring to FIG. 7, the OLED display device 200 includes a pixel driving layer 102 on a substrate 100a, a white OLED 110 on the pixel driving layer 102, and a color filter layer 190 on the white OLED 110.

Alternatively, the color filter layer 190 may be formed on an encapsulation substrate.

The white OLED 110 emits white light, and the color filter layer 190 emits corresponding red, green or blue light. Accordingly, a full-color image can be displayed, and efficiency of light emission and brightness of red, green and blue can be improved.

As described above, in the white OLED and the OLED display device including the same, three light emitting units are formed, and particularly, two light emitting units that emit blue are formed. Accordingly, light emission efficiency can be increased.

Moreover, the total thickness of the organic material layer including the first electrode is minimized. Accordingly, cost of organic material and tack time can be reduced, and low power consumption can be obtained.

Moreover, the light emitting units are formed in a vertically stacked structure. Thus, using a mask is not needed, and a large-sized OLED display device can be formed more easily than in the prior art.

Therefore, the white OLED and the OLED display device having high efficiency and low voltage can be provided.

It will be apparent to those skilled in the art that various modifications and variations can be made in a display device of the present disclosure without departing from the spirit or scope of the invention. Thus, it is intended that the present invention covers the modifications and variations of this invention provided they come within the scope of the appended claims and their equivalents.

What is claimed is:

1. An organic light emitting diode (OLED) display device comprising:
   a pixel driving layer on a substrate;
   a color filter pattern including at least three different color filter patterns that correspond to respective pixel regions;
   a first electrode connected to a thin film transistor of the pixel driving layer;
   a second electrode facing the first electrode;
   a first charge generation layer and a second charge generation layer between the first and second electrodes;
   a first light emitting unit including a first emitting material layer made of an organic material and emitting a first color, wherein the first light emitting unit is located between the first electrode and the first charge generation layer;
   a second light emitting unit including a second emitting material layer made of an organic material and emitting a second color, wherein the second light emitting unit is located between the first charge generation layer and the second charge generation layer; and
   a third light emitting unit including a third emitting material layer made of an organic material and emitting the second color of the second light emitting unit, wherein the third light emitting unit is located between the second charge generation layer and the second electrode,
   wherein the first color is yellow-green emitted using a phosphorescent dopant material of the first emitting material layer, and the second color is blue emitted using a fluorescent material of each of the second and third light emitting layers,
   wherein the thin film transistor includes:
      a semiconductor layer on the substrate;
      a gate insulating layer on the semiconductor layer;
      a gate electrode on the gate insulating layer;
      an inter-layered insulating layer on the gate electrode; and
      a source electrode and a drain electrode on the inter-layered insulating layer,
   wherein the color filter pattern is directly on the source electrode and the drain electrode and having a drain contact hole exposing the drain electrode, and
   wherein the first electrode is directly on the color filter pattern and is connected to the drain electrode through the drain contact hole.

2. The device of claim 1, wherein the color filter pattern is formed below the first electrode.

3. The device of claim 1, wherein each of the first to third light emitting units includes a common layer, wherein the common layer includes a hole transporting layer and an electron transporting layer.

4. The device of claim 3, wherein the common layer of each of the first to third light emitting units further includes a hole injection layer and an emission injection layer.

5. The device of claim 1, wherein the second light emitting unit and the third light emitting unit include a second auxiliary emitting material layer and a third auxiliary emitting material layer, respectively, the second auxiliary emitting material layer emits a same color as that of the second emitting material layer or a blue color, and the third auxiliary emitting material layer emits a same color as that of the third emitting material layer or a blue color.

6. The device of claim 1, wherein the second light emitting unit and the third light emitting unit include a second auxiliary emitting material layer and a third auxiliary emitting material layer, respectively, the second auxiliary emitting material layer emits a different color as that of the second emitting material layer or a red or green color, and the third auxiliary emitting material layer emits a different color as that of the third emitting material layer or a red or green color.

7. The device of claim 6, wherein the second auxiliary emitting material layer has a thickness of half or less than a thickness of the second emitting material layer, and the third auxiliary emitting material layer has a thickness of half or less than a thickness of the third emitting material layer.

* * * * *